United States Patent
Iwamoto et al.

[11] Patent Number: 5,950,817
[45] Date of Patent: Sep. 14, 1999

[54] CONTAINER FOR FLAT PANEL

[75] Inventors: Kenji Iwamoto; Kazuo Fujimoto, both of Tokyo, Japan

[73] Assignee: Zeon Kasei Co., Ltd., Tokyo, Japan

[21] Appl. No.: 09/010,514

[22] Filed: Jan. 21, 1998

[30] Foreign Application Priority Data

Jan. 23, 1997 [JP] Japan .................................. 9-024396

[51] Int. Cl.⁶ .................................................. B65D 85/86
[52] U.S. Cl. .......................... 206/204; 206/453; 206/707; 206/723
[58] Field of Search ..................................... 206/449, 453, 206/454, 701, 707, 708, 711, 723, 204

[56] References Cited

U.S. PATENT DOCUMENTS

| | | | |
|---|---|---|---|
| 4,815,601 | 3/1989 | Peterson et al. | 206/454 |
| 4,930,634 | 6/1990 | Williams et al. | 206/454 |
| 5,025,924 | 6/1991 | Watanabe | 206/454 |
| 5,330,053 | 7/1994 | Tabuchi et al. | 206/454 |
| 5,423,422 | 6/1995 | Boire et al. | 206/454 |
| 5,458,237 | 10/1995 | Kataoka | 206/449 |

*Primary Examiner*—Jim Foster
*Attorney, Agent, or Firm*—Armstrong, Westerman Hattori, McLeland & Naughton

[57] ABSTRACT

A container 2 for flat panel comprising: a lower end holding resilient member 38 disposed on a bottom end of a lower end bottom groove 32 to which a lower end of the flat panel 34 contained in the container 2 is inserted, and an upper end holding resilient member 50 having a belt shaped portion covering an upper end of the flat panel 34 along the longitudinal direction thereof. The upper end holding resilient member 50 has an U-shaped cross section, a pair of fitting rods extending along the longitudinal direction thereof are attached at both sides of both ends of the longitudinal direction thereof, and each end of each fitting rod 52 is attached removably in an engagement groove 58 of an adapter 56 attached in the container 2. In accordance with the container 2 for flat panel of the present invention, it is possible to take custody of or transport a plural of flat panels such as glass substrates used for flat display devices without destroying them and contaminating the surfaces of them.

7 Claims, 5 Drawing Sheets

CONTAINER FOR FLAT PANEL

BACKGROUND OF THE INVENTION

1. Field of the Invention

The present invention relates to a container for flat panels, more particularly a container for taking custody of or transporting flat panels, used for parts of flat display devices and the like, in a good condition without destroying them.

2. Description of the Related Art

In flat display devices such as liquid crystal display devices and plasma display devices, electrodes or separating walls are formed on glass substrates by means of screen printing and the like, and the glass substrates are to be transported to the another factory to assemble or re-process them during a process of producing these substrates. In this case, a container is required for taking custody of (or securely containing) and transporting the glass substrates without destroying them or contaminating the surfaces of them.

Further, a construction of a container permitting an air shield and direct transport between clean rooms is required, when these substrates are transported.

The conventional container, however, does not permit direct transport of flat panels such as glass substrates used for flat display devices between clean rooms without destroying the panels and contaminating the surfaces thereof.

SUMMARY OF THE INVENTION

In view of the foregoing circumstance, the object of the present invention is to provide a container for flat panels which is able to take custody of or transport a plurality of flat panels, such as glass substrates used for flat panel display devices, without destroying them and contaminating the surfaces of them. The other object of the present invention is to provide a container for flat panels which permits direct transport of flat panels between clean rooms.

To achieve the above-mentioned object, a container for flat panels in accordance with the present invention comprises:

- a lower end holding resilient member disposed on a bottom end of a lower end bottom groove to which a lower end of the flat panel contained in the container is inserted, and
- an upper end holding resilient member having a belt shaped portion covering an upper end of the flat panel along the longitudinal direction thereof.

Preferably, the upper end holding resilient member has an U-shaped cross section, a pair of fitting rods extending along the longitudinal direction thereof are attached at both sides of both ends of the longitudinal direction thereof, and each end of each fitting rod is attached removably in an engagement groove of an adapter attached in said container.

Further, the upper end holding resilient member may be formed to have the belt-shaped portions and support portions alternately and continuously along one direction. The support portions hold the fitting rods respectively.

The lower end holding resilient member is preferably a rope-shaped rubber member attached in a bottom of an attachment groove extending substantially perpendicular to the lower end holding groove of a lower end holding block provided with a plural of the lower end holding grooves. The lower end holding block is preferably attached in the bottom of the container.

Shock absorber members are preferably attached in both sides of the container. The shock absorber members are provided with guide grooves into which the sides of the flat panels are slidably inserted.

Preferably, the inside of the container is purged with an inert gas. The inert gas is preferably into the space between respective flat panels held in the container. As an inert gas, nitrogen gas is preferable in consideration of handling operation, transportation cost and so on.

Preferably, a drying agent box is removably attached in the container, in order that the moisture inside the container can be removed. Preferably the drying agent box is provided with a bore hole having a filter for adjusting the inside pressure of the container. Because it should be considered that the container is transported by airplane and the like.

Preferably, the outside of the container is covered by an outer box which is able to be disassembled and be assembled repeatedly. Preferably, the container of the present invention is taken custody of and is transported in the state that the container is contained in the outer box. The outer box may be disassembled in the semi-clean room and only the container therein may be transported into the clean room.

In the container for a flat panel of the present invention, the flat panels such as glass substrates contained in the container are held at each upper end of flat panel by the upper end holding resilient member and are held at each lower end of flat panel by the lower end holding resilient member. Namely, a plurality of the flat panels are held to be sandwiched between up and down directions. Accordingly, the flat panels held resiliently between up and down directions are not destroyed, even if the vibration is exerted to the container. Further, since there are spaces between the flat panels, the surfaces of the flat panels are not contaminated. Especially in case of blowing the inert gas such as nitrogen gas into the space between the flat panels, it may be possible to protect effectively from the adhesion of dust or particles on the surfaces of the flat panels.

Further, in case that the upper end holding resilient member is comprised of the belt shaped portion having substantially U-shaped cross section, the upper end portion of the flat panel is covered by the upper end holding resilient member so that the holding of the upper end is secured and a strong construction capable of bearing not only up and down vibrations but also front, back, left and right vibrations is obtained.

In accordance with the present invention, the construction of covering the outside of the container by the outer box makes it possible also to prevent the adhesion of dust and particles on the surfaces of the container itself, so that the container is able to be transported directly between clean rooms.

BRIEF DESCRIPTION OF THE DRAWINGS

Other objects and features of the present invention will be described in detail with reference to accompanying drawings, in which.

DESCRIPTION OF THE PREFERRED EMBODIMENTS

Figure 1:
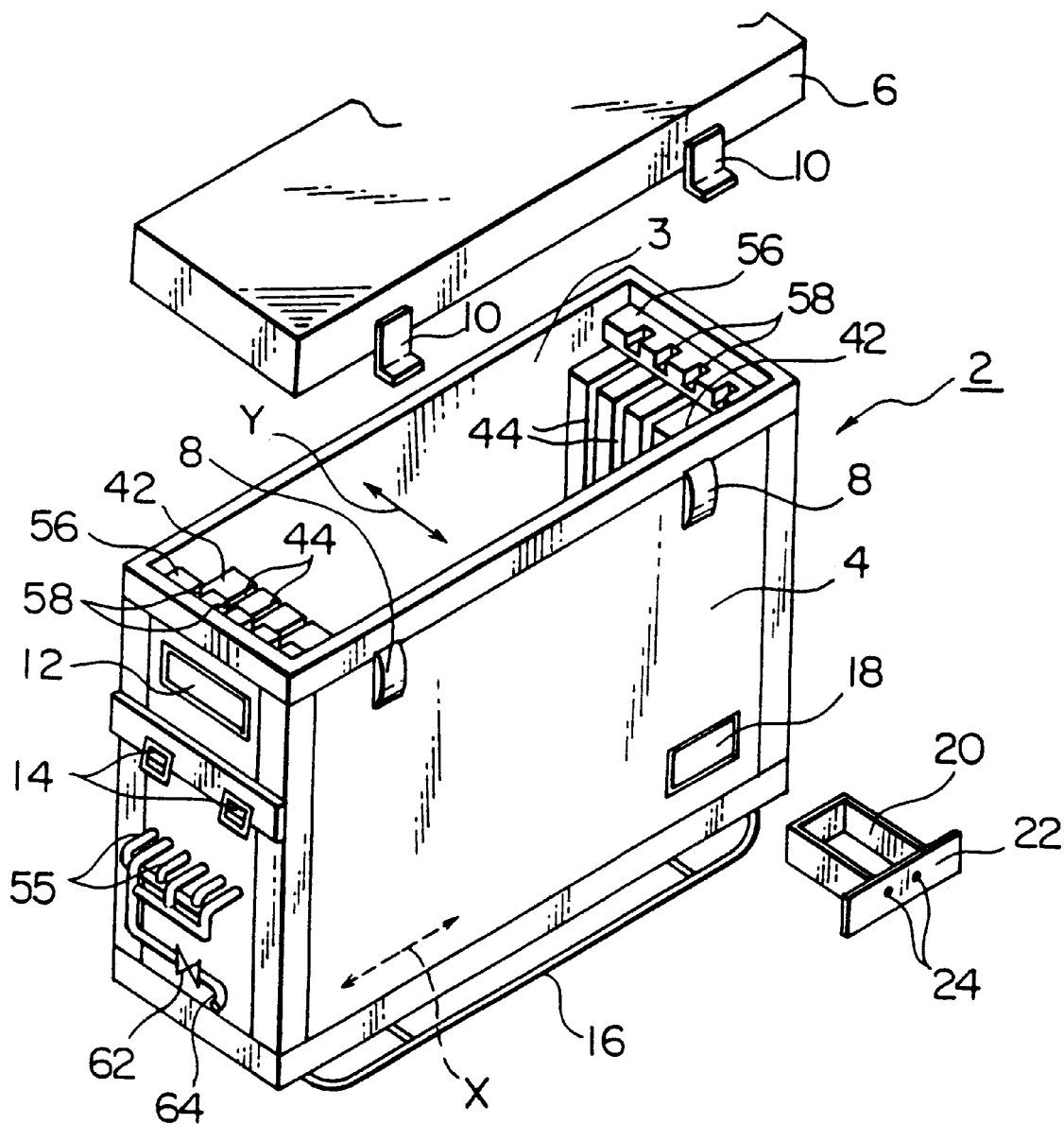
FIG. 1 is a schematic perspective view of a container of an embodiment of the present invention.

As shown in FIG. 1, the container 2 for flat panels in accordance with the present embodiment comprises a rectangular shaped main container 4 having an opening portion 3 at the upper end thereof. The main container 4 is comprised of a complex material of synthetic resin and metal such as aluminum.

A lid member 6 is removably attached on the open portion 3 of the main container 4. The lid member 6 is comprised of the same material as that of the main container 4. One-touch control type lock members 8 are attached on the mutually opposite side walls of the container 4 near the opening portion. The lock members are able to removably engage with projection pieces 10 formed on the corresponding portions of the lid member 6. The engagement of the projection pieces 10 with the lock members 8 makes it possible to fix the lid member 6 on the opening portion of the main container 4 and to seal off the inside. In the case of opening the lid member 6, the lock members 8 are operated to release the engagement with the projection pieces 10, so that the lid member 6 is able to be removed with one touch control.

One side wall (the side wall having a narrower horizontal width in this embodiment) of the main container 4 is provided with a sight glass for viewing inside, through which the inside of the container is able to be viewed for confirmation. The sight glass may also be disposed on the other side wall of the container 4.

In the present embodiment, handles 14 are provided on the both of the narrower side walls of the main container 4. The container 2 is capable of being carried by gripping the handles.

Leg portions 16 are attached outside the bottom of the main container 4. An open portion 18 for a drying agent box 20 is provided with the main container 4 at the lower end portion of the wider side wall thereof. A drying agent box 20 is inserted removably into the open portion. In a drying agent box 20, drying agent such as silica gel is contained so that the moisture inside the container is absorbed.

In the present embodiment, a front wall 22 of the drying agent box is provided with bore holes and a filter for adjusting the inside pressure of the container. The bore holes 24 and the filter permit the flow between the inside and outside of the container 2 in order to adjust the inside pressure of the container when the container is transported by airplane and the like. A filter attached with the bore holes 24, such as a paper filter, may be used.

Figure 4A:
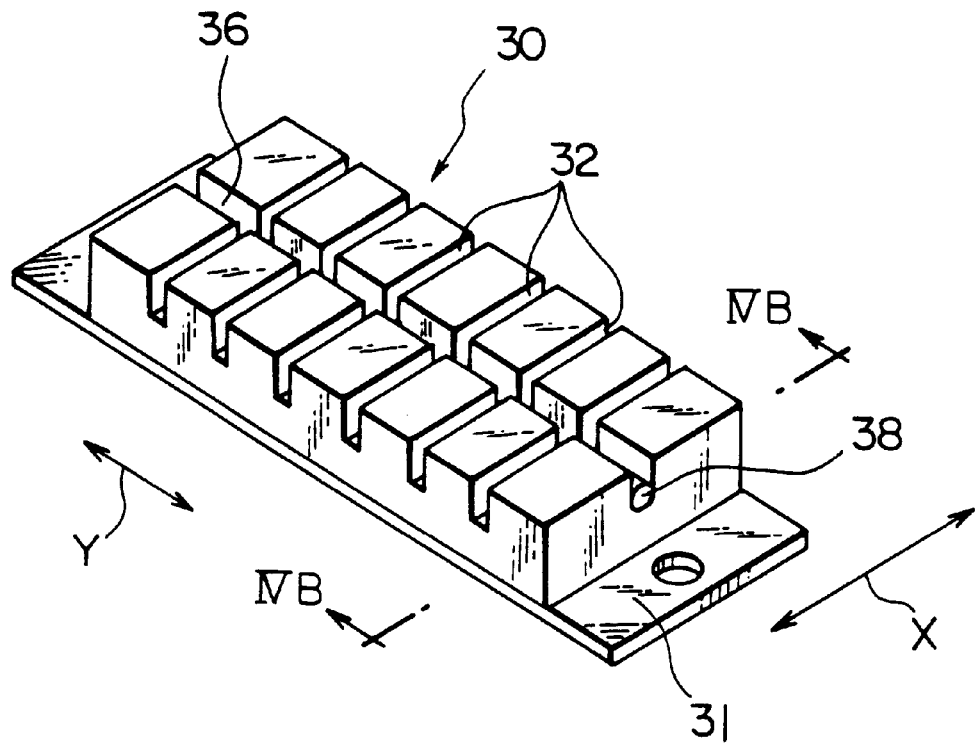
FIG. 4A is a perspective view of a lower end holding resilient member.
Figure 4B:
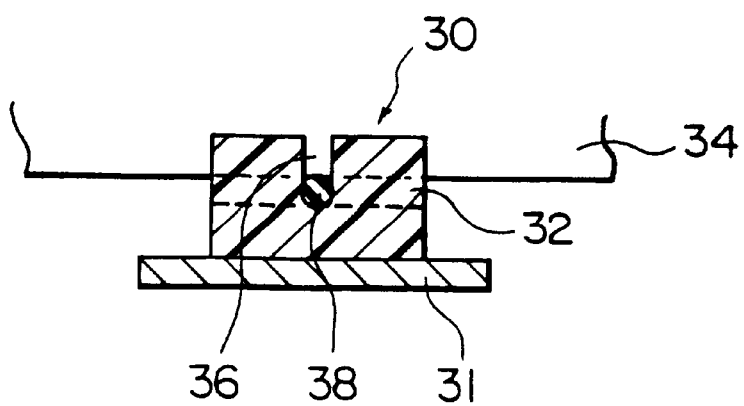
FIG. 4B is a partial cross section along the IVB—IVB line showing in the FIG. 4A.

In the present embodiment, lower end holding blocks 30 shown in FIGS. 4A and 4B are disposed inside the bottom wall of the main container 4 of FIG. 1 in the predetermined distances along the longitudinal direction X of the bottom wall. The block 30 is comprised of, for example, resin form. The bottom surface of the block 30 is provided with an attaching plate 31. The attaching plate 31 is comprised of metal plate of stainless steel or the like. The plate 31 is attached inside the bottom wall of the main container 4 by means of bolt, screw or the like.

On the upper surface of the block 30, a plurality of lower end holding grooves 32 are formed substantially parallel along the X direction and in the predetermined distances along the Y direction (which is perpendicular to the X direction). Lower ends of the glass substrates are inserted respectively in the lower end holding grooves 32 as shown in FIG. 4B. Namely, the number of the lower end holding grooves 32 formed thereon corresponds to the number of the glass substrates capable of being contained in the container 2.

As shown in FIGS. 4A and 4B, an attaching groove 36 extending along the Y direction substantially perpendicular to the lower end holding grooves 32 is formed across the center of the lower end holding grooves 32. The depths of these lower end holding grooves and the attaching groove 36 are substantially the same and are preferably 10–15 mm, more preferably 12–13 mm. Each groove width of the lower end holding grooves 32 is preferably the width of approximately 50–110% of the thickness of the glass substrate 34, more preferably the width of approximately 80–95% of the same. In case that the width is too small, the insertion of the lower end of the glass substrate 34 tends not to be easy, while in case that the width is too big, the holding of the lower end of the glass substrate tends not to be stable.

The groove width of the attaching groove 36 is determined by such as an outer diameter of a rope-liked lower end holding resilient member 38 disposed in the bottom of the groove 36 and is substantially the same as the groove width of the lower end holding groove 32. In the present embodiment, the rope-shaped lower end holding resilient member 38 is comprised of a member which is other than silicone rubber and which has elasticity. Examples of the member include diene rubbers such as styrene-butadiene rubber (SBR), butadiene rubber (BR), isoprene rubber (IP), acrylonitrile-butadiene rubber (NBR) and chloroprene rubber (CR), butyl rubber (IIR), ethylene-propylene-diene terpolymer rubber (EPDM), acrylic rubber, chlorosulfonated polyethylene rubber, fluororubber, urethane rubber, polysulfide rubber, foam of any of the rubbers mentioned above and foam of urethane or nylon. As shown in FIG. 4B, the lower end of the glass substrate 34 inserted in the lower end holding groove 32 is placed on the lower end holding resilient member 38 to hold it by means of the elastic force thereof.

Figure 2:
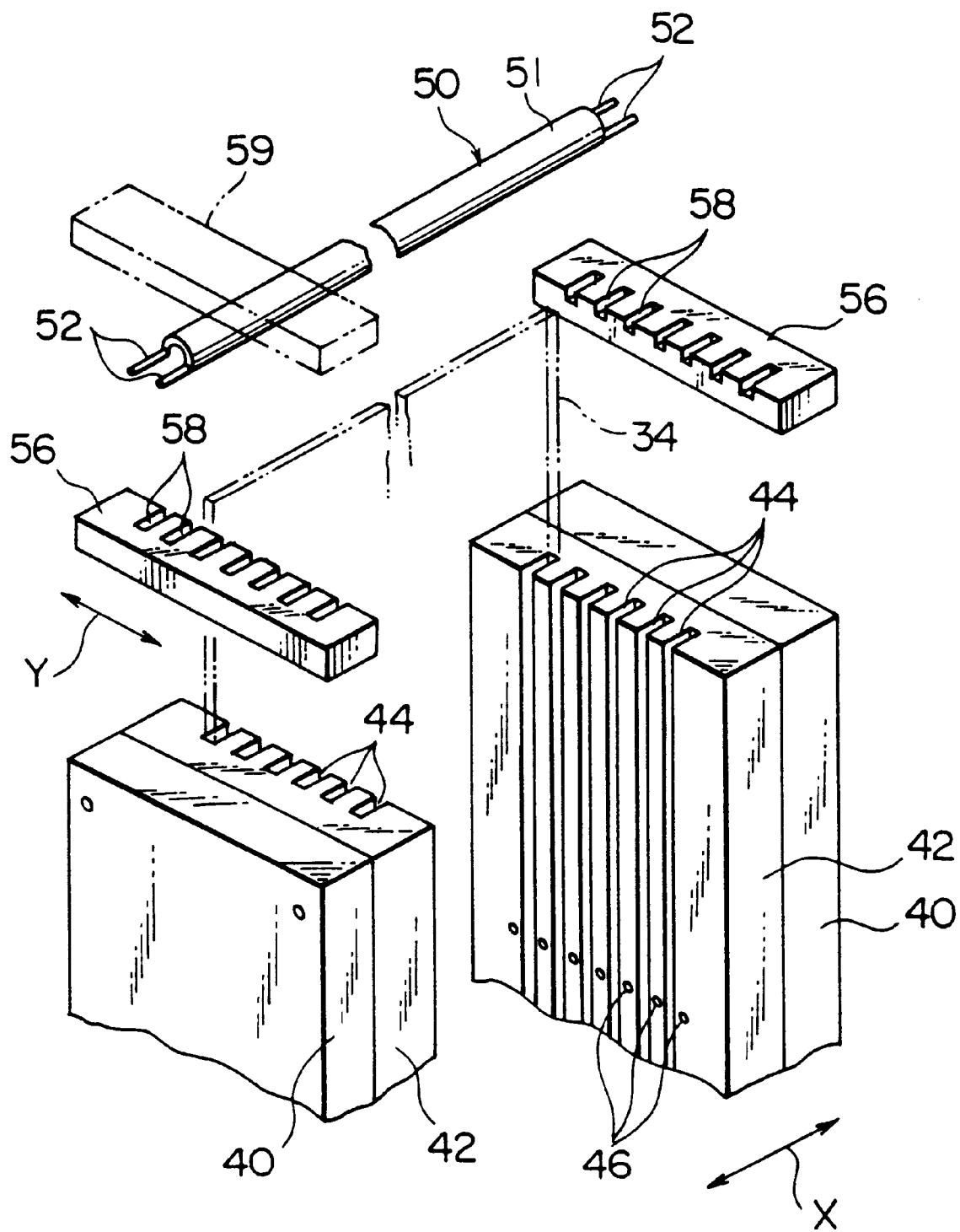
FIG. 2 is an exploded perspective view showing the inside of the container.

As shown in FIGS. 1 and 2, spacers 40 and shock absorber members 42 are disposed inside the side walls located at both ends along the longitudinal direction X of the main container 4. The spacer 40 is used for adjusting the width inside the container 2 in case of containing the glass substrates 34 having different widths along the X direction and the material thereof is not particularly limited but preferably is a light one.

The shock absorber member 42 may be comprised of the same plastic form as the block 30 shown in FIGS. 4A and 4B, for example. Each of the shock absorber members 42 is provided with guide grooves 44 extending in parallel along the up and down direction and spaced apart predetermined distances along the Y direction. The arrangement distances of the guide grooves 44 are substantially the same as the arrangement distances of the lower end holding grooves 32 of the block 30 shown in FIGS. 4A and 4B. As shown in FIG. 2, both side ends of the glass substrate 34 are inserted slidably into these guide grooves. Note that the holding of the glass substrate 34 is secured by both of the above-mentioned lower end holding resilient member 38 and the below-mentioned upper end holding resilient member 50 or 50a. The guide grooves 44 of the shock absorber member 42 only play a roll of guiding. In the foregoing view, each groove width of the guide grooves 44 is made bigger than each groove width of the lower end holding grooves 32 by preferably 5–40%, more preferably 10–25%.

The shock absorber members 42 and spacers 40 are provided with perforated holes 46 at the positions between the guide grooves and at the both end positions along the laminating direction of glass substrates. These perforated holes 46 are connected with a conduit tube 55 shown in FIG. 1 to permit gas flow. The conduit tube 55 is provided with a valve 62 and a supply port 64. A nitrogen gas cylinder (not shown) is to be connected to the supply port 64 and the valve 62 is to be controlled, so that nitrogen gas may blow in from the perforated holes 46 to purge the inside of the container with nitrogen gas. Since these perforated holes 46 are formed between the guide grooves 44, the nitrogen gas may blow between the glass substrates 34 held in the container 2.

Figure 3A:
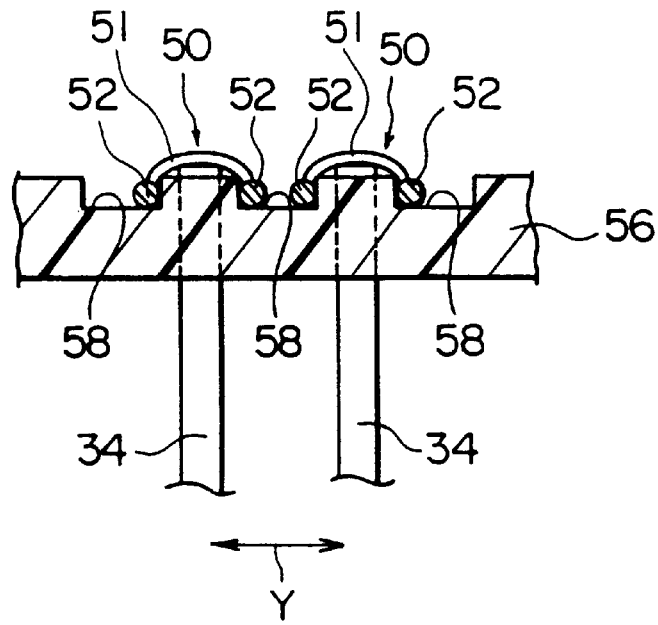
FIGS. 3A and 3B are schematic views showing holding structure with upper end holding resilient members.

As shown in FIGS. 1 and 2, adapters 56 are attached respectively on the inner walls of the container over the spacers 40 (near the open portion 3) in the main container 4. The adapter 56 is provided with engagement grooves 58 in the predetermined distances along the Y direction. These engagement grooves 58 are formed thereon so that each groove is located at both side positions of each glass substrate contained in the container as shown in FIG. 3A. Namely, the grooves 58 are formed at alternately different positions from the guide grooves 44 shown in FIG. 2.

As shown in FIG. 2, each end portion of fitting rods 52 attached at both sides of both ends of the longitudinal direction of the upper end holding resilient member 50 shown in FIG. 2 may be engaged in each groove wall portion of each engagement groove 58.

As shown in FIGS. 2 and 3A, the upper end holding resilient member 50 is comprised of a belt-shaped portion 51 having a U-shaped cross section and is, for example, comprised of the same material as that of the lower end holding resilient member 38 shown in FIGS. 4A and 4B. The belt-shaped portion 51 of the resilient member 50 is preferably comprised of a sponge of which surface is covered by a sheet for preventing static electricity. It is because of preventing static electricity.

The fitting rods 52 holding the belt-shaped portion 51 of the upper end holding resilient member 50 at both sides along the longitudinal direction are, for example, comprised of stainless steel and are designed to protrude from both ends of the longitudinal direction of the resilient member 50. As shown in FIG. 3A, both ends of the fitting rods are able to be engaged in the groove wall portions of the engagement grooves 58 of the adapters 56. A stopper member 59 shown in FIG. 2 is mounted removably on the adapter 56, respectively, so that the fitting rods 52 are fixed in the engagement grooves 58 of the adapter 56 and consequently each upper end holding resilient member 50 holds and covers the upper end of the glass substrates 34 respectively along the longitudinal direction thereof, as shown in FIG. 3A.

Figure 3B:
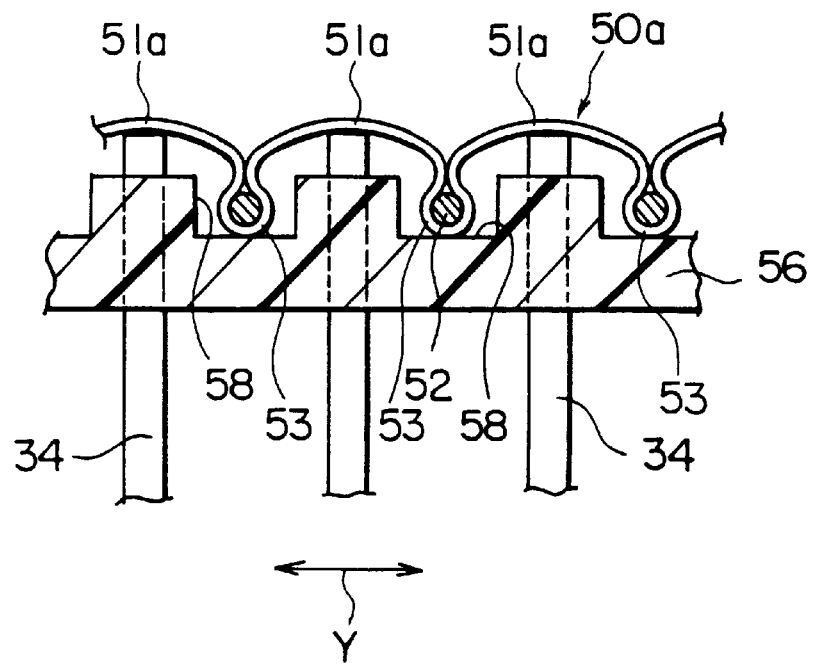

Note that the upper end holding resilient member of the present invention may be an upper end holding resilient member 50*a* on which belt-shaped resilient portions 51*a* having a U-shaped cross section are formed continuously from a sheet material as shown in FIG. 3B. The sheet material is comprised of elastic sheet made from the same material as that of the resilient member 50. The sheet material is processed by means of molding, heating and/or pressing to form belt-shaped portions 51*a* and support portions 53 alternately and continuously along the Y direction. The support portions 53 hold the fitting rods 52 respectively. The fitting rods 52 of the resilient member 50*a*, spaced apart at predetermined distances, may be fixed in the engagement grooves 58 of the adapter 56.

Figure 5:
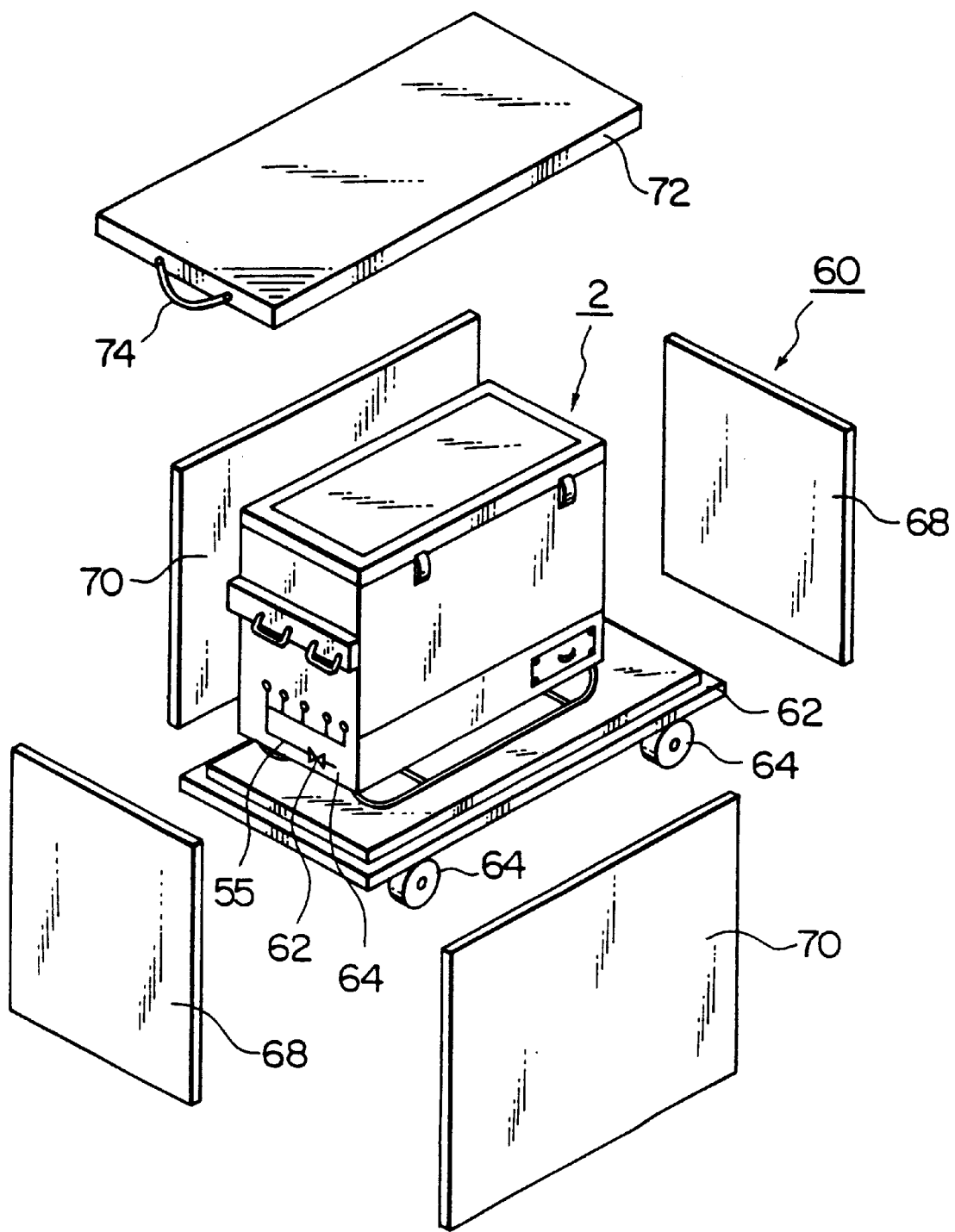
FIG. 5 is a schematic exploded perspective view of the outer box.

The container 2 of the present invention is taken custody of and transported in a condition that the container is contained in the outer box 60 which is able to be disassembled and assembled repeatedly as shown in FIG. 5. Note that the container 2 is contained in the outer box 60 in the condition that the nitrogen gas cylinder is connected to the supply port 64 to purge inside the container 2 with nitrogen gas.

The outer box 60 is comprised of a bottom plate 62 provided with, for example, rollers 64 for transportation, side plates 68 and 70 placed upward on the four side of the bottom plate 62, and a lid member 72 with a handle 74 covering the upper end of the side plates 68, 70. These plates are able to be disassembled and assembled repeatedly.

When the glass substrates are to be taken out from the container 2, at first, the outer box 60 is disassembled and the container 2 is taken out. The work for disassembling the outer container 60 is conducted in the semi-clean room. The container 2, taken out from the outer box 60, is then transported into the clean room and the lid member 6 shown in FIG. 1 is removed from the main container 4. After that, stopper 59 shown in FIG. 2 is removed from the adapter 56, so that it is possible to disconnect the upper end holding resilient members 50. Then, the upper end holding members 50 are disconnected from the engagement grooves 58, so that it is possible to pull up each glass substrate along the guide groove 44. Then, the glass substrates 34 are taken out from the container.

When each glass substrate is to be contained in the container 2, the operation may be conducted in a reverse order to that described above.

In the container 2 for flat panels as in the present embodiment, the glass substrates contained in the container 2 are held at each upper end of the flat panel by the upper end holding resilient members 50 or 50*a* as shown in FIGS. 3A, 3B and are held at each lower end of the glass substrates 34 by the lower end holding resilient members 38 as shown in FIG. 4B. Namely, a plurality of the glass substrates 34 are held to be sandwiched between up and down directions.

Accordingly, the glass substrates 34 held resiliently between up and down directions are not destroyed, even if a vibration is exerted to the container 2. Further, since there are spaces between the glass substrates 34, the surfaces of the glass substrates 34 are not contaminated. Especially, since it is designed that nitrogen gas is blown into the spaces between the glass substrates through the perforated holes 46 shown in FIG. 2, it may be possible to effectively protect from adhesion of dust or particles on the surfaces of the glass substrates 34.

Further, since the upper end holding resilient member 50 is comprised of the belt shaped portion 51 or 51*a* having substantially U-shaped cross section, the upper end portion of the glass substrate 34 is covered by the upper end holding resilient member 50 or 50*a* as shown in FIGS. 3A and 3B, so that the holding of the upper end portion of the glass substrate 34 is secured and a strong construction capable of bearing not only up and down vibrations but also front, back, left and right vibrations is obtained.

Further, in accordance with the present embodiment, as shown in FIG. 5, the construction of covering the outside of the container 2 by the outer box 60 makes it possible to prevent adhesion of dust or particles on the surfaces of the container itself, so that the container is able to be transported directly between clean rooms.

Note that the present invention is not restricted to the above-mentioned embodiments and may be modified in a variety of modes within the spirit of the present invention.

For example, the flat panels capable of being contained in the container of present invention are not restricted to the glass substrates, but may be other flat electronic parts.

As mentioned above, in accordance with the container for flat panel of the present invention, it is possible to take custody of or transport a plurality of flat panels, such as glass substrates used for flat display devices, without destroying them and contaminating the surfaces of them.

We claim:

1. A container for holding a flat panel, comprising:

a lower end holding resilient member disposed on a bottom end of a lower end bottom groove to which a lower end of the flat panel contained in the container is inserted;

an upper end holding resilient member having a belt shaped portion, with a U-shaped cross section, covering an upper end of the flat panel along the longitudinal direction thereof; and an adapter having an engagement groove, wherein said upper end holding resilient member has a pair of fitting rods extending from both sides of both ends of the longitudinal direction thereof, and each end of each fitting rod is removably mounted in said engagement groove of said adapter.

2. The container for holding a panel as set forth in claim 1, wherein the inside of said container is purged with an inert gas.

3. The container for holding a flat panel as set forth in claim 1, wherein said lower end holding resilient member is a rope-shaped rubber member mounted on an attachment groove at a bottom thereof extending substantially perpendicular to the lower end holding groove of a lower end holding block mounted on the bottom of the container.

4. The container for holding a flat panel as set forth in claim 1, wherein shock absorber members are attached to the both sides of the container and the shock absorber members are provided with guide grooves being in sliding engagement with longitudinal sides of said flat panels.

5. The container for holding a flat panel as set forth in claim 1, wherein a drying agent box is attached removably in the container and the drying agent box is provided with a bore hole having a filter for adjusting the inside pressure of the container.

6. The container for holding a flat panel as set forth in claim 1, wherein the outside of the container is covered by an outer box which is able to be disassembled and be assembled repeatedly.

7. The container for holding a flat panel as set forth in claim 1, wherein said upper end holding resilient member has belt-shaped portions and support portions alternately and continuously arranged along a direction perpendicular to the longitudinal direction of said engagement groove of said adapter.

* * * * *